United States Patent
Lee et al.

(10) Patent No.: US 11,404,848 B2
(45) Date of Patent: Aug. 2, 2022

(54) VERTICAL-CAVITY SURFACE-EMITTING LASER

(71) Applicant: SEOUL VIOSYS CO., LTD., Ansan-si (KR)

(72) Inventors: Ki Hwang Lee, Ansan-si (KR); Jeong Rae Ro, Ansan-si (KR); Byueng Su Yoo, Ansan-si (KR); Yoon Sang Jeon, Ansan-si (KR); Gong Hee Choi, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 187 days.

(21) Appl. No.: 16/720,634

(22) Filed: Dec. 19, 2019

(65) Prior Publication Data

US 2020/0203927 A1 Jun. 25, 2020

Related U.S. Application Data

(60) Provisional application No. 62/784,616, filed on Dec. 24, 2018.

(51) Int. Cl.
*H01S 5/183* (2006.01)
*H01S 5/42* (2006.01)
*H01S 5/042* (2006.01)

(52) U.S. Cl.
CPC ...... *H01S 5/18311* (2013.01); *H01S 5/18361* (2013.01); *H01S 5/423* (2013.01); *H01S 5/04254* (2019.08); *H01S 2301/176* (2013.01)

(58) Field of Classification Search
CPC .. H01S 5/18311; H01S 5/423; H01S 5/18361; H01S 5/04254; H01S 2301/176
See application file for complete search history.

(56) References Cited

U.S. PATENT DOCUMENTS

| | | | | |
|---|---|---|---|---|
| 5,729,566 | A | * 3/1998 | Jewell | H01S 5/18341 257/97 |
| 6,658,040 | B1 | 12/2003 | Hu et al. | |
| 7,944,957 | B2 | 5/2011 | Suzuki et al. | |
| 9,742,153 | B1 | 8/2017 | Barve et al. | |
| 9,929,536 | B1 | * 3/2018 | Lin | H01S 5/04257 |
| 2004/0091010 | A1 | * 5/2004 | Choquette | H01S 5/18327 372/43.01 |
| 2004/0101009 | A1 | * 5/2004 | Johnson | H01S 5/18308 372/46.013 |
| 2004/0264541 | A1 | * 12/2004 | Wang | B82Y 20/00 372/99 |

FOREIGN PATENT DOCUMENTS

| KR | 10-2002-0010531 | 2/2002 |
| KR | 10-2008-0100118 | 11/2008 |
| KR | 10-2017-0099368 | 8/2017 |

\* cited by examiner

*Primary Examiner* — Yuanda Zhang
(74) *Attorney, Agent, or Firm* — H.C. Park & Associates, PLC

(57) ABSTRACT

A vertical-cavity surface-emitting laser (VCSEL) including a lower mirror, an upper mirror having an insulation region including implanted ions and an isolation region surrounded by the insulation region, an active layer interposed between the lower mirror and the upper mirror, an aperture forming layer interposed between the upper mirror and the active layer, and including an oxidation layer and a window layer surrounded by the oxidation layer, and a plurality of oxidation holes disposed in the isolation region and passing through the upper mirror and the aperture forming layer.

20 Claims, 12 Drawing Sheets

VERTICAL-CAVITY SURFACE-EMITTING LASER

CROSS-REFERENCE TO RELATED APPLICATION

This application claims the benefit of U.S. Provisional Application No. 62/784,616, filed on Dec. 24, 2018, which is hereby incorporated by reference for all purposes as if fully set forth herein.

BACKGROUND

Field

Exemplary embodiments of the invention relate to a highly reliable vertical-cavity surface-emitting laser.

Discussion of the Background

A vertical-cavity surface-emitting laser (VCSEL) is a laser that emits a laser beam in a vertical direction from a substrate surface.

A typical VCSEL includes an active layer disposed between mirrors. Electrons and holes injected through the mirrors generate light from the active layer, and a laser is generated and emitted through resonance by the mirrors.

Current flowing perpendicular to the VCSEL needs to be limited to a small region. As such, methods using etching and oxidation have been used to form a conventional VCSEL. For example, an isolated post is formed by etching mirror layers and the active layer to form a trench having a ring shape, such that current may be concentrated in an aperture of a small region by forming an oxidation layer using the trench.

In this case, however, etching a wide area to form the ring-shaped trench may increase manufacturing complexity. Moreover, when forming a pad electrode, connection between the pad and an emitter passes through the trench, which may increase the risk of electrical disconnection and lower the process yield. In addition, a trench having a large area is formed around the emitter, and thus, the emitter's reliability is also adversely affected by a surface defect.

The above information disclosed in this Background section is only for understanding of the background of the inventive concepts, and, therefore, it may contain information that does not constitute prior art.

SUMMARY

Vertical-cavity surface-emitting lasers (VCSELs) constructed according to exemplary embodiments of the invention have high reliability and are capable of preventing the occurrence of electrical disconnection due to a trench.

Exemplary embodiments also provide VCSELs capable of preventing the performance of an emitter from being degraded by defects.

Additional features of the inventive concepts will be set forth in the description which follows, and in part will be apparent from the description, or may be learned by practice of the inventive concepts.

A vertical-cavity surface-emitting laser (VCSEL) according to an exemplary embodiment includes a lower mirror, an upper mirror having an insulation region including implanted ions and an isolation region surrounded by the insulation region, an active layer interposed between the lower mirror and the upper mirror, an aperture forming layer interposed between the upper mirror and the active layer, and including an oxidation layer and a window layer surrounded by the oxidation layer, and a plurality of oxidation holes disposed in the isolation region and passing through the upper mirror and the aperture forming layer.

The insulation region may extend from the upper mirror to a portion of the lower mirror.

The VCSEL may further include an ohmic contact layer disposed on the upper mirror, in which the ohmic contact layer may include a circular portion and protrusions protruding outwardly from the of the circular portion.

The circular portion may have a partially incised ring-shape.

The oxidation holes may be disposed between the protrusions.

The oxidation holes may have smaller widths than those of the protrusions, respectively.

The VCSEL may further include a surface protection layer covering the ohmic contact layer and the upper mirror, and an upper insulation layer disposed on the surface protection layer and covering the oxidation holes, in which the oxidation holes may pass through the surface protection layer.

The VCSEL may further include a plurality of via holes passing through the upper insulation layer and the surface protection layer and exposing the ohmic contact layer, in which the via holes may be disposed to correspond to the protrusions.

The VCSEL may further include a pad and a connector disposed on the upper insulation layer, in which the pad may be disposed in the insulation region, and the connector may extend from the pad and electrically connect the pad and the ohmic contact layer through the via holes.

The oxidation holes may have substantially a circular or a quadrangular shape.

A vertical-cavity surface-emitting laser (VCSEL) according to another exemplary embodiment includes a lower mirror, an upper mirror having an insulation region including implanted ions and an isolation region surrounded by the insulation region, an emitter array including a plurality of emitters disposed in the isolation region, an active layer interposed between the lower mirror and the upper mirror, an aperture forming layer interposed between the upper mirror and the active layer, and including an oxidation layer and a window layer surrounded by the oxidation layer, and a plurality of oxidation holes disposed in the isolation region and passing through the upper mirror and the aperture forming layer, each oxidation hole being disposed to correspond to each emitter of the emitter array.

The insulation region may extend from the upper mirror to a portion of the lower mirror.

The VCSEL may further include ohmic contact layers disposed on the upper mirror to correspond to each emitter of the emitter array, respectively, in which each ohmic contact layer may have a circular portion and protrusions protruding outwardly from the circular portion, and the oxidation holes may be disposed between the protrusions.

The circular portion may have a partially incised ring-shape.

The oxidation holes may have smaller widths than those of the protrusions, respectively.

The VCSEL may further include a surface protection layer covering the ohmic contact layer and the upper mirror, and an upper insulation layer disposed on the surface protection layer and covering the oxidation holes, in which the oxidation holes may pass through the surface protection layer.

The VCSEL may further include a plurality of via holes passing through the upper insulation layer and the surface protection layer and exposing the ohmic contact layer, in which the via holes may be disposed to correspond to the protrusions.

The VCSEL may further include a pad and a connector disposed on the upper insulation layer, in which the pad may be disposed in the insulation region, and the connector may extend from the pad and electrically connect the pad and the ohmic contact layer through the via holes.

The connector may have a mesh shape including circular openings corresponding to each emitter.

The oxidation holes may have substantially a circular or a quadrangular shape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
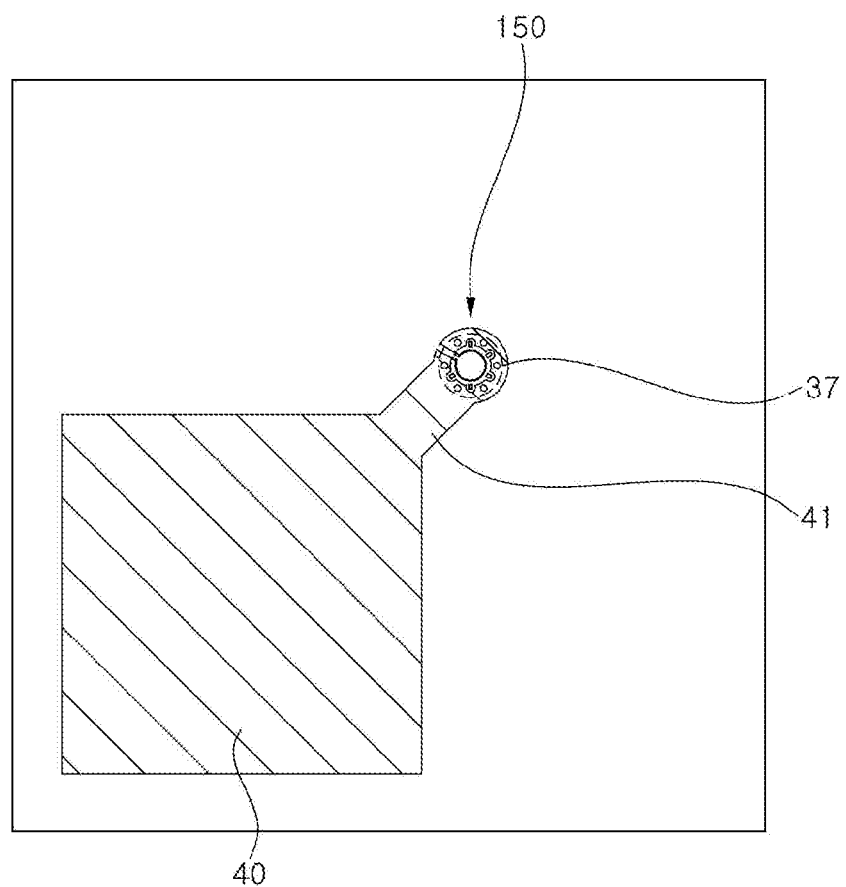
FIG. 1 is a schematic plan view of a VCSEL according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
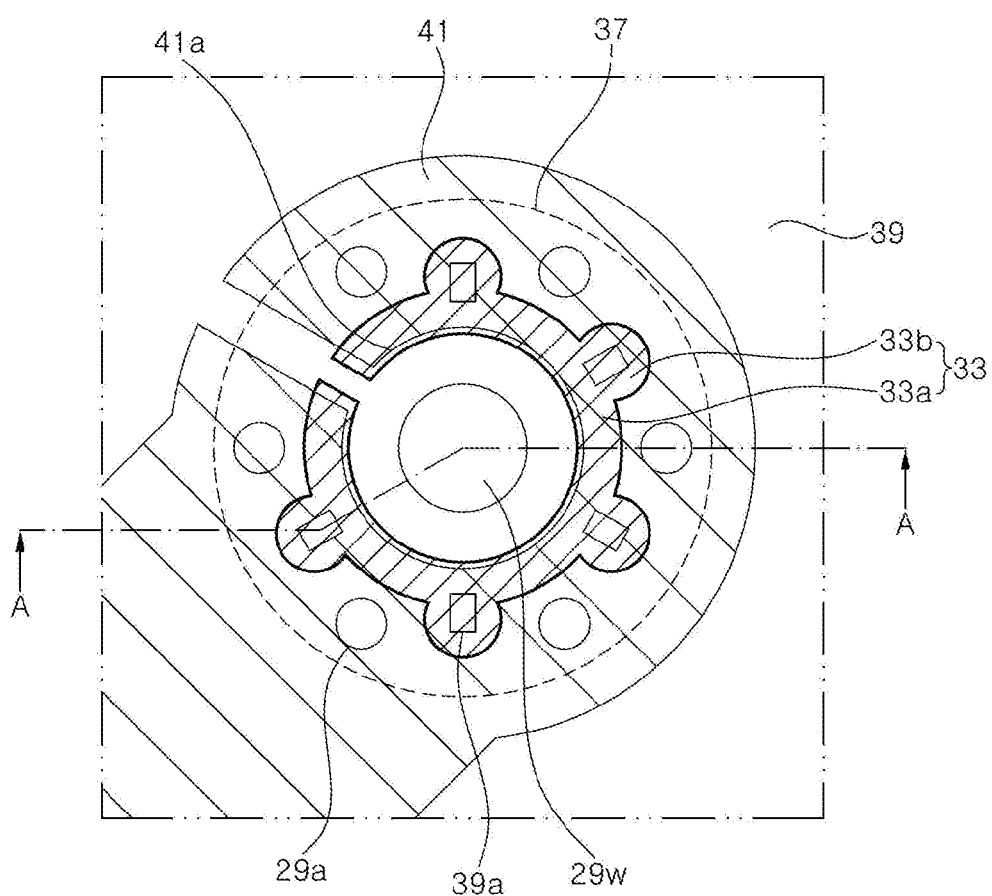
FIG. 2A is an enlarged schematic plan view of an emitter region of FIG. 1.
Figure 2B:
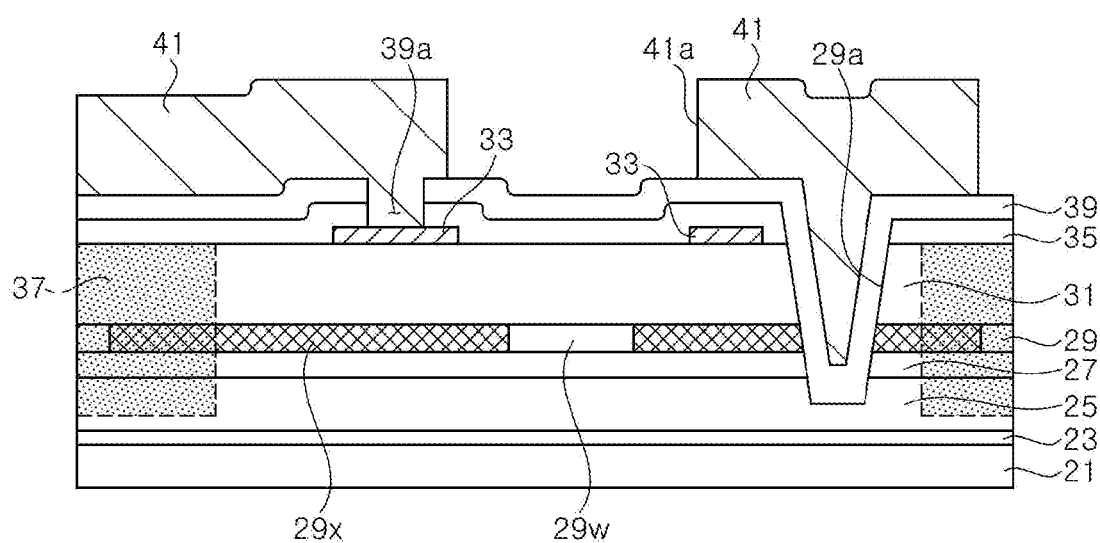
FIG. 2B is a schematic cross-sectional view taken along line A-A of FIG. 2A.

FIG. 1 is a schematic plan view of a VCSEL according to an exemplary embodiment, FIG. 2A is an enlarged schematic plan view of an emitter region of FIG. 1, and FIG. 2B is a schematic cross-sectional view taken along line A-A of FIG. 2A.

Referring to FIG. 1, FIG. 2A, and FIG. 2B, a vertical-cavity surface-emitting laser (VCSEL) 100 according to an exemplary embodiment includes an emitter 150, a pad 40, and a connector 41. The emitter 150 includes a lower mirror 25, an active layer 27, an aperture forming layer 29, and an upper mirror 31. The VCSEL 100 may also include a substrate 21, a buffer layer 23, an ohmic contact layer 33, a surface protection layer 35, and an upper insulation layer 39. The VCSEL 100 may also include an insulation region 37 by ion implantation, and an isolation region surrounded by the insulation region, and may include oxidation holes.

The substrate 21 may be a conductive substrate. For example, the substrate 21 may be a semiconductor substrate, such as n-type GaAs. The substrate 21 may also be a growth substrate for growing semiconductor layers disposed thereon, and may be selected according to the semiconductor layer to be grown thereon.

The buffer layer 23 may be formed to assist the growth of the semiconductor layers, but in some exemplary embodiments, the buffer layer 23 may be omitted. When the substrate 21 is a GaAs substrate, the buffer layer 23 may be, for example, a GaAs layer.

The lower mirror 25 has a distributed Bragg reflector (DBR) structure, and may include n-type semiconductor layers. The lower mirror 25 may be formed by, for example, repeatedly stacking semiconductor layers having different refractive indices. For example, the lower mirror 25 may be formed by alternately stacking an AlGaAs layer having a relatively low Al content, and an AlGaAs layer having a relatively high Al content. In particular, the lower mirror 25 may be formed by alternately stacking an $Al_{0.15}Ga_{0.85}As$ layer having an Al content of 15%, and an $Al_{0.85}Ga_{0.15}As$ layer having an Al content of 85%. As an n-type impurity, Si may be doped at a concentration of approximately 1 to $3 \times 10^{18}/cm^3$. The lower mirror 25 may include, for example, 30 or more pairs of semiconductor layers having different refractive indices. A thickness of each layer in the lower mirror 25 may be about one-fourth of a wavelength of light.

The active layer 27 may be disposed on the lower mirror 25, and may contact the lower mirror 25. The active layer 27 may have a barrier layer and a well layer, and the well layer may be interposed between the barrier layers. The active layer 27, in particular, may have a multi-quantum well structure having a plurality of well layers, and may include, for example, a stacked structure of GaAs/InGaAs/GaAs. Compositions of the barrier layer and the well layer may be varied according to a desired laser wavelength, and the well layer may include, for example, an InAlGaAs-based four-component, three-component, or two-component structure. However, the inventive concepts are not limited thereto, and in some exemplary embodiments, the active layer 27 may include InAlGaN-based or InAlGaP-based semiconductor layers, and in this case, the barrier layer and the well layer may have a nitride-based or phosphide-based composition.

The well layer in the active layer 27 may be formed of an un-doped layer, and the barrier layer may also be formed of an un-doped layer. A thickness of the well layer may be approximately 2 nm to 8 nm, and the thickness of the barrier layer may be approximately in a range of 2 nm to 15 nm.

The upper mirror 31 is disposed on the active layer 27. The upper mirror 31 may have a distributed Bragg reflector (DBR) structure, and may include p-type semiconductor layers. The upper mirror 31 may be formed by, for example, repeatedly stacking semiconductor layers having different refractive indices. For example, the upper mirror 31 may be formed by alternately stacking an AlGaAs layer having a relatively low Al content and an AlGaAs layer having a relatively high Al content, as in the lower mirror 25. In particular, the upper mirror 31 may be formed by alternately stacking an $Al_{0.15}Ga_{0.85}As$ layer having an Al content of 15%, and an $Al_{0.85}Ga_{0.15}As$ layer having an Al content of 85%. As a p-type impurity, for example, C may be doped at a concentration of about 1 to $5 \times 10^{18}/cm^3$. The upper mirror 31 may include, for example, 20 or more pairs of semiconductor layers having different refractive indices. The number of pairs in the upper mirror 31 may be relatively smaller than that in the lower mirror 25, without being limited thereto.

Meanwhile, a thickness of each layer may be set to be about one-fourth of a wavelength of light.

The aperture forming layer 29 is disposed between the active layer 27 and the upper mirror 31. The aperture forming layer 29 may include an oxidation layer 29x and a window layer 29w. The window layer 29w is surrounded by the oxidation layer 29x, thereby forming an aperture defining a passage of current. The aperture forming layer 29 may be formed of, for example, an AlGaAs layer having a higher Al content than the layers in the upper mirror 31. For example, an Al content in the aperture forming layer 29 may be about 90% or more. The oxidation layer 29x is formed by oxidizing the AlGaAs layer in a region except the window layer 29w.

A width of the aperture formed by the oxidation layer 29x, in particular, the width of the window layer 29w is not particularly limited, but in some exemplary embodiments, may be in a range of about 8 μm to about 12 μm.

Although FIG. 2A shows that the window layer 29w or the aperture has a disk shape, however, the inventive concepts are not limited thereto. In some exemplary embodiments, the window layer 29w may have other shapes, such as a polygonal shape close to the disk. This will be described in more detail with reference to FIGS. 9A through 9D.

The emitter 150 includes an insulation region 37 formed by ion implantation, and an isolation region surrounded by the insulation region 37. Ions may be implanted into the upper mirror 31, and into the aperture forming layer 29 and the active layer 27. In some exemplary embodiments, ions may further be implanted into some thickness regions of the lower mirror 25.

The insulation region 37 may improve light efficiency by preventing current from flowing to other regions except for the aperture (e.g., window layer 29w).

The ohmic contact layer 33 is disposed on the upper mirror 31. In particular, the ohmic contact layer 33 may form an ohmic contact with the upper mirror 31 in the isolation region surrounded by the insulation region 37. The ohmic contact layer 33 may include, for example, Ti, Pt, and Au, and ohmic contact may be formed using a rapid thermal annealing process, for example. The ohmic contact layer 33, as shown in FIG. 2A, may include a partial ring-shaped circular portion 33a and protrusions 33b protruding outwardly from the circular portion 33a.

The surface protection layer 35 protects the upper mirror 31 and the ohmic contact layer 33 during an ion implantation process. The surface protection layer 35 may be formed of a light transmissive substance, such as a silicon oxide film or a silicon nitride film. The surface protection layer 35 may have a thickness of an integer multiple of one-fourth of a light wavelength. For example, when the surface protection layer 35 is formed of $Si_3N_4$, the surface protection layer 35 may be formed to have a thickness, which is an integer multiple of about 118 nm. In addition, the surface protection layer 35 is formed to have a tensile strain, and may be formed at, for example, about 250° C.

Oxidation holes 29a are formed to expose the aperture forming layer 29. In this case, the oxidation holes 29a may pass through the upper mirror 31 and the aperture forming layer 29, and further, may pass through the active layer 27 and a portion of the lower mirror 25. The oxidation holes 29a may also pass through the surface protection layer 35.

The oxidation holes 29a may be disposed outside of the ohmic contact layer 33, and in particular, may be disposed between the protrusions 33b. Further, the oxidation holes 29a are formed in the isolation region surrounded by the insulation region 37. The oxidation holes 29a are disposed in the isolation region away from the insulation region 37 formed by ion implantation, and thus, defects generated during ion implantation may be prevented from moving to the aperture while forming the oxidation layer 29x. In addition, since the ohmic contact layer 33 is formed to have the protrusions 33b, the oxidation holes 29a may be disposed closer to one another, thereby reducing the size of the emitter 150.

In addition, the oxidation holes 29a may be formed to have sizes smaller than those of the protrusions 33b, respectively. For example, a width of the oxidation hole 29a may be less than that of the protrusion 33b. In this manner, penetration of moisture or the like through the oxidation holes 29a after the oxidation layer is formed may be suppressed. For example, a depth of the oxidation holes 29a may be about 3 μm and a diameter of the hole may be about 4 μm.

The aperture forming layer 29 is oxidized through the oxidation holes 29a, and thus, the oxidation layer 29x and the window layer 29w are defined. In this case, the upper mirror 31, the active layer 27, and the lower mirror 25 exposed to sidewalls of the oxidation holes 29a may be partially oxidized.

The upper insulation layer 39 covers the surface protection layer 35 and the oxidation holes 29a. The upper mirror 31, the oxidation layer 29x, the active layer 27, and the lower mirror 25 exposed in the oxidation holes 29a are covered with the upper insulation layer 39 to be insulated. The upper insulation layer 39 may be formed of a light transmissive substance, such as a silicon oxide film or a silicon nitride film. The upper insulation layer 39 may also be formed to have a thickness, which is an integer multiple of one-fourth of a light wavelength. For example, when the upper insulation layer 39 is formed of $Si_3N_4$, the surface protection layer 35 may be formed to have a thickness, about 200 nm, about 300 nm, or about 500 nm. In addition, the upper insulation layer 39 is formed to have a tensile strain, and may be formed at, for example, 250° C.

Via holes 39a passing through the upper insulation layer 39 and the surface protection layer 35 may be formed to expose the ohmic contact layer 33. The via holes 39a are disposed correspond to the protrusions 33b of the ohmic contact layer 33. As shown in FIG. 2A, the via holes 39a may be formed to expose the protrusion 33b and the circular portion 33a together. Although FIG. 2A shows the via holes 39a as having a quadrangular shape, the inventive concepts are not limited thereto, and in some exemplary embodiments, the via holes 39a may have a substantially circular shape, for example.

The pad 40 and the connector 41 may be disposed on the upper insulation layer 39. The pad 40 is a region to which bonding wires may be disposed, and is disposed over a relatively wide region. The pad 40 may be disposed, for example, in the insulation region 37 formed by ion implantation, and thus, may reduce parasitic capacitance.

The connector 41 electrically connects the pad 40 and the ohmic contact layer 33. The connector 41 may be connected to the ohmic contact layer 33 through the via holes 39a. The connector 41 may have a partial ring-shaped circular portion along the ohmic contact layer 33, and an opening 41a may be provided inside the ring-shaped circular portion to emit a laser beam.

The pad 40 and the connector 41 may include substantially the same metal material, such as Ti/Pt/Au. The pad 40 and the connector 41 may be formed to have a thickness of about at least 2 μm.

In some exemplary embodiments, another pad, for example, an n-pad may be formed under the substrate 21. When the substrate 21 is a GaAs substrate, the n-pad may be formed of AuGe/Ni/Au (900 Å/300 Å/1000~3000 Å), for example.

FIGS. 3A, 3B, 4A, 4B, 5A, 5B, 6A, and 6B are schematic plan views and cross-sectional views illustrating a method of manufacturing a VCSEL according to an exemplary embodiment. Each cross-sectional view is a view taken along line A-A of the corresponding plan view.

Figure 3A:
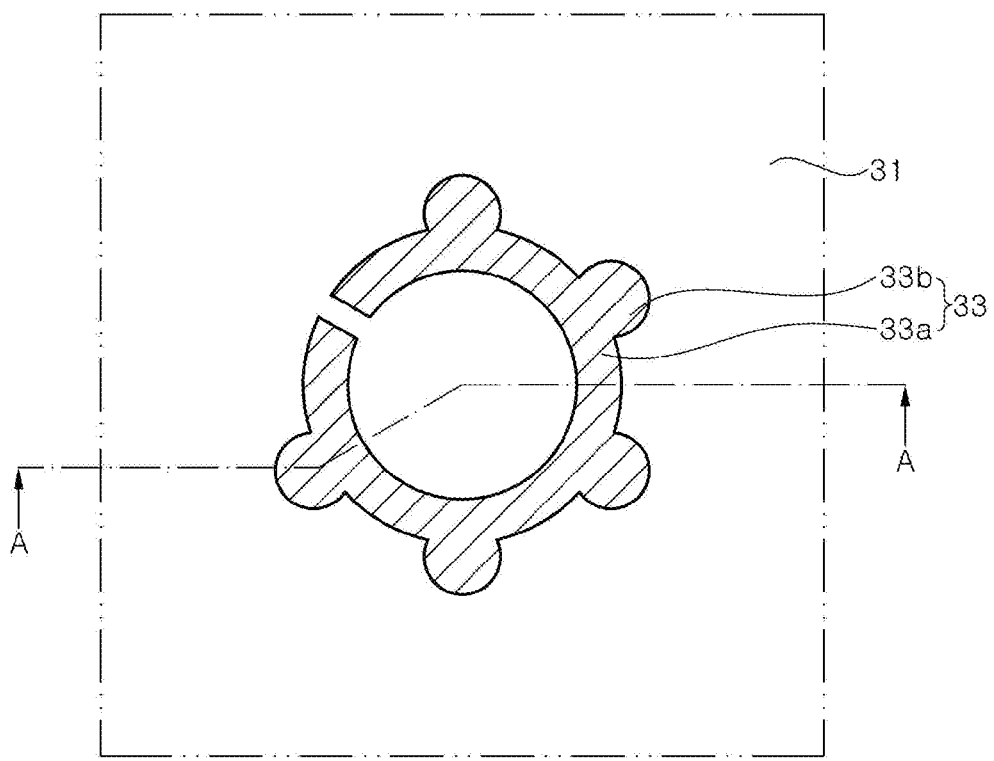
FIGS. 3A, 3B, 4A, 4B, 5A, 5B, 6A, and 6B are schematic plan views and cross-sectional views illustrating a method of manufacturing a VCSEL according to an exemplary embodiment.
Figure 3B:
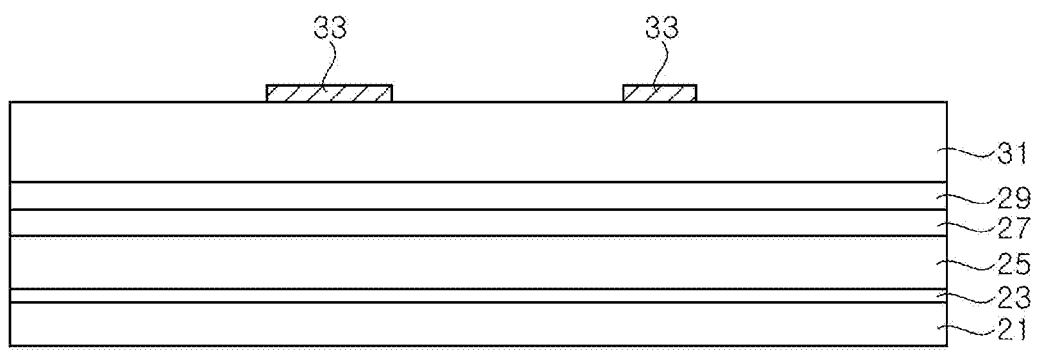

Referring to FIG. 3A and FIG. 3B, layers 23, 25, 27, 29, and 31 are formed on a substrate 21, which may include a semiconductor material, and an ohmic contact layer 33 is formed thereon.

The substrate 21 may be, for example, an n-type GaAs substrate. The semiconductor layers may include a buffer layer 23, a lower mirror 25, an active layer 27, an aperture forming layer 29, and an upper mirror 31. The semiconductor layers may be formed using, for example, epitaxial growth techniques, such as metal organic chemical vapor deposition or molecular beam epitaxy.

The buffer layer 23 may be formed of, for example, a GaAs layer disposed on the substrate 21. The lower mirror 25 may be formed on the buffer layer 23, and the active layer 27, the aperture forming layer 29, and the upper mirror 31 may be sequentially formed on the lower mirror 25. The lower mirror 25 and the upper mirror 31 may be formed by repeatedly stacking AlGaAs/AlGaAs having different Al compositions, respectively. Since the specific structures of the lower mirror 25, the active layer 27, the aperture forming layer 29 and the upper mirror 31 have been described in detail above, repeated descriptions thereof will be omitted to avoid redundancy.

The ohmic contact layer 33 is formed on the upper mirror 31. The ohmic contact layer 33 may include a partial ring-shaped circular portion 33a and protrusions 33b protruding outwardly from the circular portion 33a. The ohmic contact layer 33 may be heat-treated through a rapid thermal annealing process after forming a metal layer using a lift-off technique, for example. The metal layer may be formed of, for example, Ti/Pt/Au, which may be formed to have thicknesses of about 300 Å, 300 Å, and 1000 to 3000 Å, respectively. In this manner, an ohmic contact may be formed between the ohmic contact layer 33 and the upper mirror 31 by the thermal annealing process.

In the illustrated exemplary embodiment, although a single ohmic contact layer 33 is described as being formed on the substrate 21, in some exemplary embodiments, the substrate 21 may have a diameter of, for example, about 10 mm, and multiple ohmic contact layers 33 may be formed in each device region.

While a negative photoresist or a positive photoresist, as a mask, may be used to form the ohmic contact layer 33, in some exemplary embodiments, the positive photoresist may be used for a high density array.

Figure 4A:
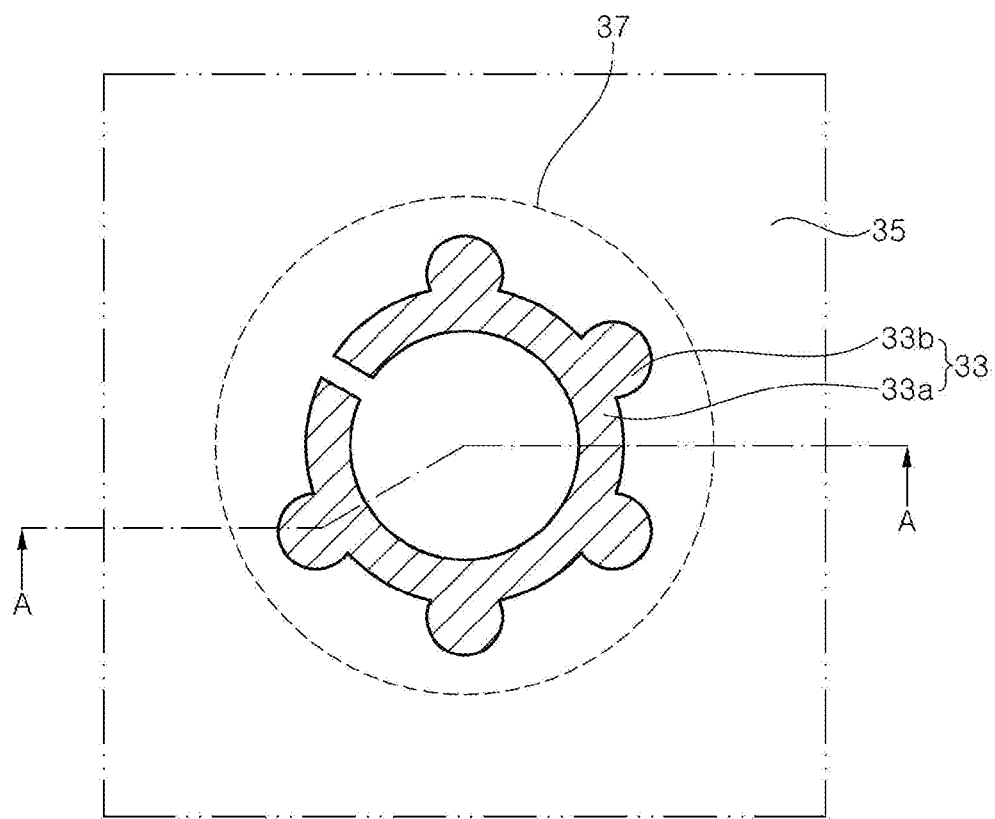
Figure 4B:
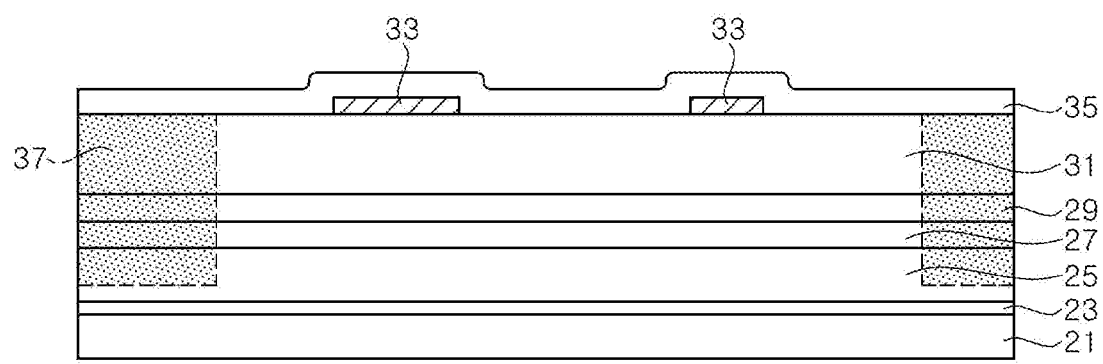

Referring to FIG. 4A and FIG. 4B, a surface protection layer 35 covering the upper mirror 31 and the ohmic contact layer 33 is formed. The surface protection layer 35 protects the surface of the upper mirror 31 during an ion implantation process (e.g., implantation).

The surface protection layer 35 may be formed of, for example, $Si_3N_4$ or $SiO_2$, and may have a thickness, which is an integer multiple of one-fourth of a light wavelength. For example, when the surface protection layer 35 is formed of $Si_3N_4$, the surface protection layer 35 may have a thickness, which is an integer multiple of about 118 nm.

Next, a photoresist is formed on the surface protection layer 35, and ions are implanted through the upper mirror 31 by the ion implantation process using the photoresist as a mask. Hydrogen ions may be implanted, thereby converting an ion implanted region into an is insulation region. An implant energy of hydrogen ions may be used up to about 350 keV, and the photoresist may be formed to have a thickness, for example about 8 μm, sufficient to prevent hydrogen ions of this energy.

The photoresist is formed to cover the ohmic contact layer 33, and thus, ion implantation is performed outside of the ohmic contact layer 33. As shown in FIG. 4A, an isolation region may be defined as a circular region by ion implantation, and an insulation region 37 is formed outside thereof. The insulation region 37 may be formed up to a partial thickness of the lower mirror 25 as shown in FIG. 4B. After the ion implantation is complete, the photoresist is removed.

Figure 5A:
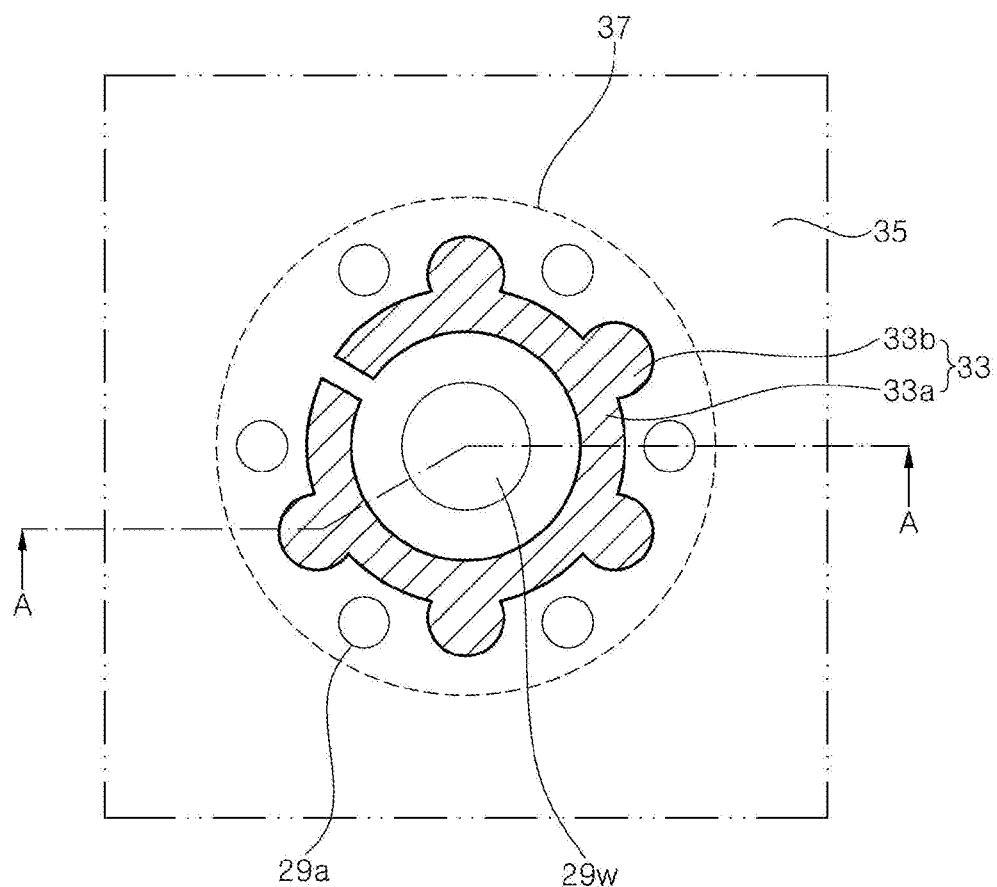
Figure 5B:
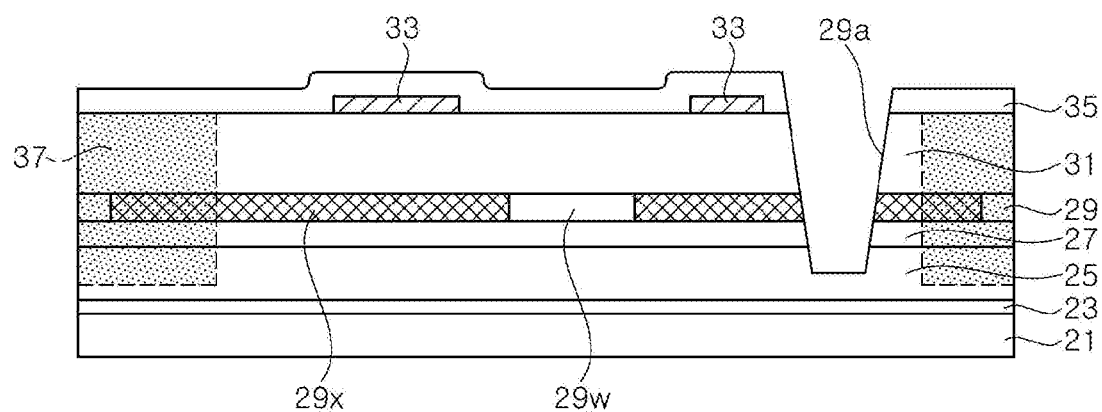

Referring to FIG. 5A and FIG. 5B, oxidation holes 29a are formed. The oxidation holes 29a may pass through the surface protection layer 35, the upper mirror 31, the aperture forming layer 29, and the active layer 27, and may pass through a partial thickness of the lower mirror 25.

In addition, the oxidation holes 29a are formed in the isolation region surrounded by the insulation region 37, and thus, are spaced apart from the ion implanted region.

The oxidation holes 29a may be disposed between the protrusions 33b, and may have sizes smaller than those of the protrusions 33b. The oxidation holes 29a have a depth of about 3 μm, a diameter (or width) of about 4 μm at a side of an inlet, and sidewalls thereof may be inclined at about 80 degrees. The shapes of the oxidation holes 29a may vary, which will be described later in more detail with reference to FIGS. 9A through 9D. Since the ohmic contact layer 33 is formed to have the protrusions 33b, the width of the circular portion 33a may be reduced, thereby reducing a distance between the oxidation holes 29a.

Subsequently, the aperture forming layer 29 exposed through the oxidation holes 29a may be oxidized. Oxidation may be performed at, for example, in a range of 400° C. to 430° C., and, by adjusting an Al composition ratio of the aperture forming layer 29, the temperature and composition thereof may be set to exhibit an oxidation rate of 10 times or more as compared to those of the layers in the lower and upper mirrors 25 and 31.

An oxidation layer 29x is formed in the aperture forming layer 29 by the oxidation process. The oxidation layer 29x proceeds to the inside of the aperture forming layer 29 through the exposed aperture forming layer 29 in an inner wall of the oxidation holes 29a. Accordingly, a window layer 29w (aperture) is formed under a region surrounded by the ohmic contact layer 33. Meanwhile, as shown in FIG. 5B, a portion of the oxidation layer 29x may also be formed in the insulation region 37.

Since the oxidation proceeds at a relatively high temperature of about 400° C. to about 430° C., defects formed in the insulation region 37 may move by ion implantation. At this time, since the oxidation hole 29a are disposed in the isolation region surrounded by the insulation region 37, the defects may be prevented from moving toward the window layer 29w.

Figure 6A:
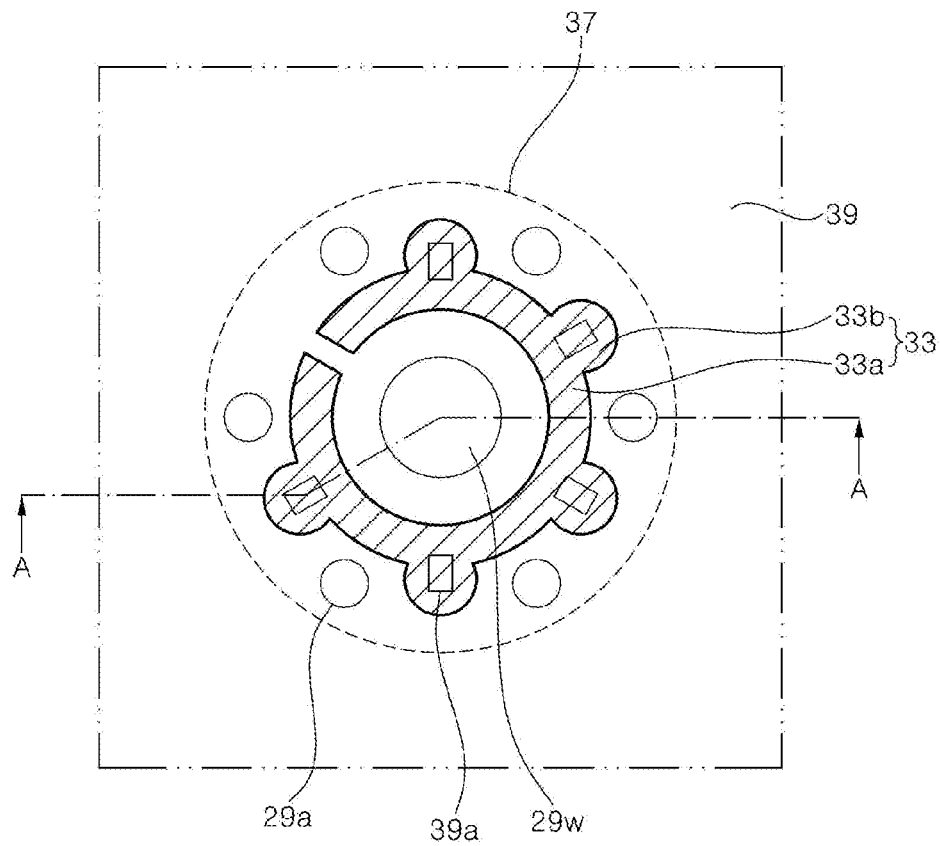
Figure 6B:
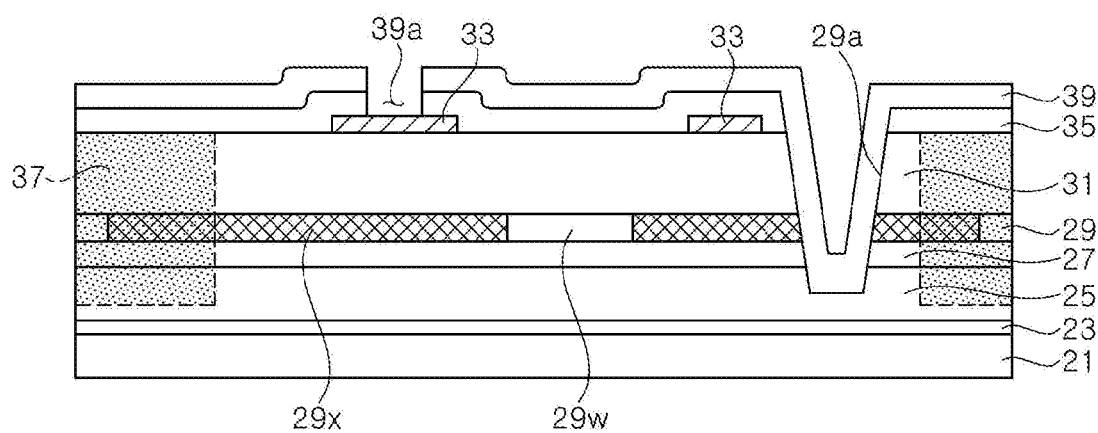

Referring to FIG. 6A and FIG. 6B, an upper insulation layer 39 is formed on the surface protection layer 35. The upper insulation layer 39 may be formed of a light transmissive substance, and may be formed of, for example, $Si_3N_4$ or $SiO_2$. The upper insulation layer 39 covers sidewalls and a bottom of the oxidation holes 29a to insulate the semiconductor layers exposed in the oxidation holes 29a.

Meanwhile, via holes 39*a* exposing the ohmic contact layer 33 may be formed by patterning the upper insulation layer 39 and the surface protection layer 35. The via holes 39*a* may be formed to correspond to the protrusions 33*b* of the ohmic contact layer 33, as shown in FIG. 6A.

In some exemplary embodiments, when the via holes 39*a* are formed, a device isolation region, for example, a scribing line for dividing the substrate 21 into a plurality of device regions may be formed together. The scribing line is formed by etching the surface protection layer 35 and the upper insulation layer 39, such that the upper insulation layer 39 may be prevented from being peeled off during a scribing process to divide devices in subsequent processes.

Subsequently, a pad 40 and a connector 41 are formed, as shown in FIG. 1. The pad 40 and the connector 41 may be formed using a lift off technique, for example, and may be formed of, for example, Ti/Pt/Au.

Thereafter, the structure is divided into individual devices along the scribing line, thereby completing the VCSEL of FIG. 1. In some exemplary embodiments, an n-pad may be further formed on the lower surface of the substrate 21 before dividing the substrate 21.

Figure 7:
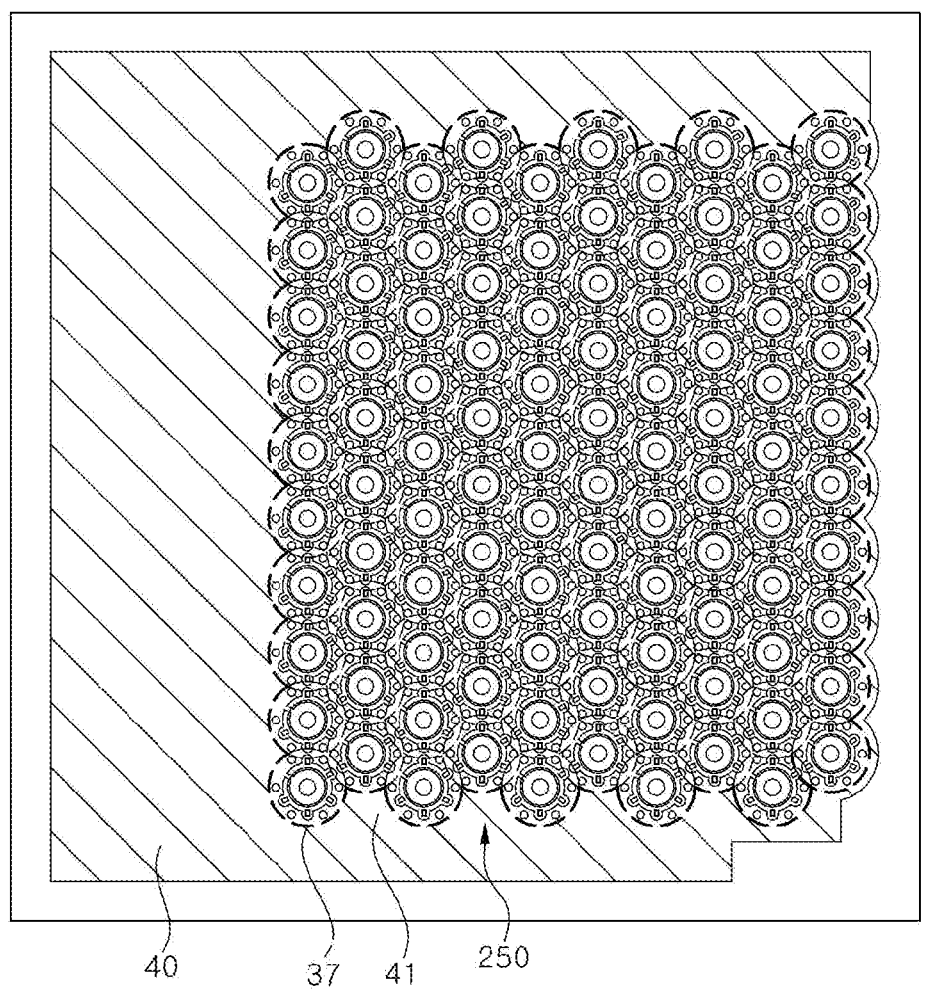
FIG. 7 is a schematic plan view of a VCSEL according to another exemplary embodiment.
Figure 8A:
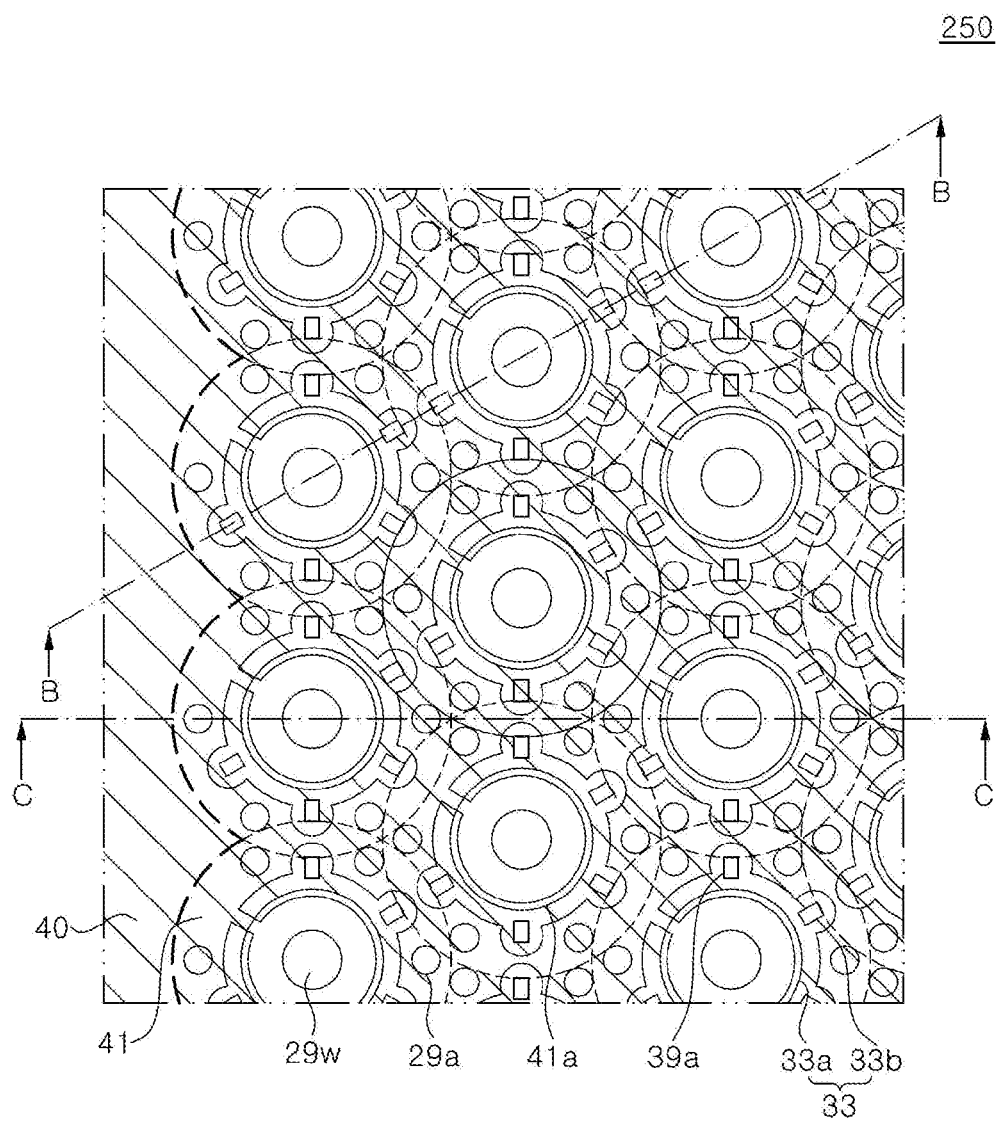
FIG. 8A is an enlarged schematic plan view of a portion of an emitter array of FIG. 7.
Figure 8B:
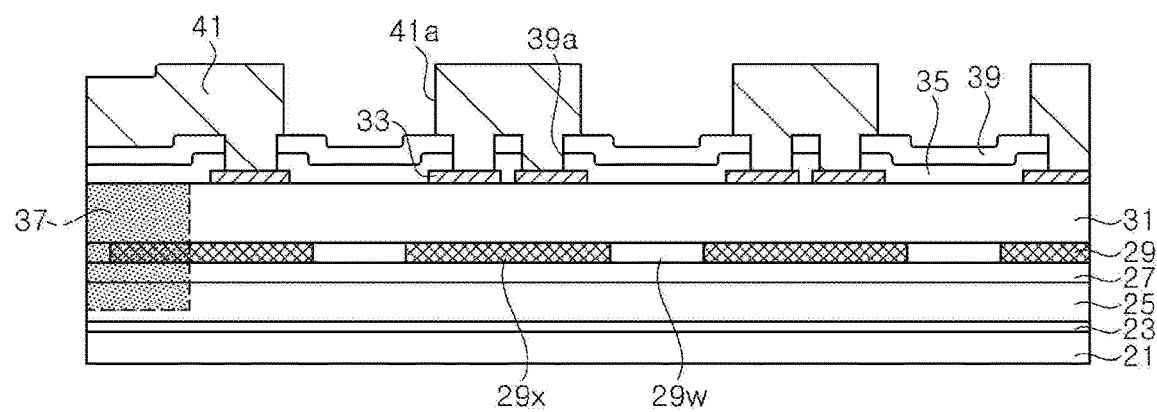
FIG. 8B is a schematic cross-sectional view taken along line B-B of FIG. 8A.
Figure 8C:
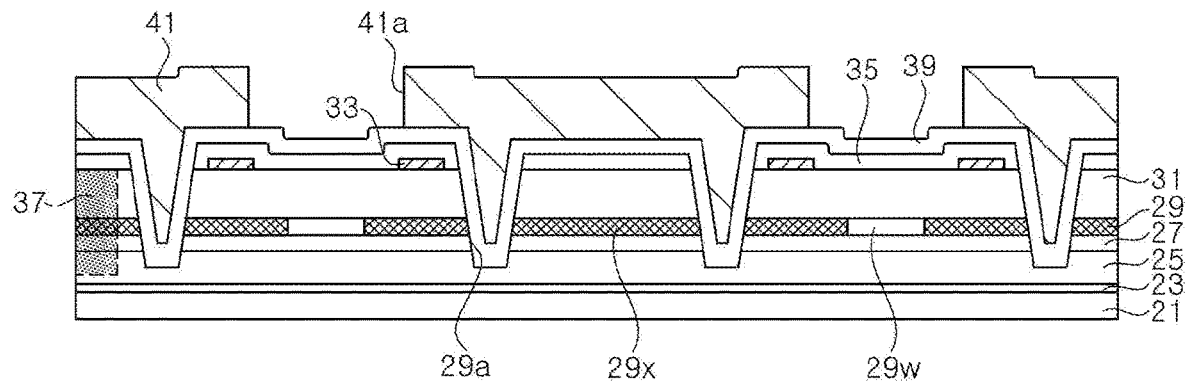
FIG. 8C is a schematic cross-sectional view taken along line C-C of FIG. 8A.

FIG. 7 is a schematic plan view of a VCSEL according to another exemplary embodiment, FIG. 8A is an enlarged schematic plan view of a portion of an emitter array of FIG. 7, FIG. 8B is a schematic cross-sectional view taken along line B-B of FIG. 8A, and FIG. 8C is a schematic cross-sectional view taken along line C-C of FIG. 8A.

Referring to FIG. 7, FIG. 8A, FIG. 8B, and FIG. 8C, a VCSEL 200 according to the illustrated exemplary embodiment is generally similar to the VCSEL 100 described with reference to FIG. 1, FIG. 2A, and FIG. 2B, except that the VCSEL 200 includes a plurality of emitter arrays 250, and, accordingly, the shape of the pad 40 may be modified. As such, repeated descriptions of substantially the same elements forming the VCSEL will be omitted to avoid redundancy.

The emitters may be disposed in substantially a honeycomb shape on the substrate 21. An emitter array region 250 may be surrounded by an insulation region 37 by ion implantation, and the pad 40 is disposed in the insulation region 37. The pad 40 may be formed on one side of the substrate 21 adjacent to the array region 250.

As shown in FIG. 8A, although lines indicating boundary regions of ion implantation are shown in each emitter region, since the lines in the emitter array region 250 overlap with each other, the insulation region 37 may not be formed in the emitter array region 250 by ion implantation. More particularly, the ion implantation is performed only outside of a boundary line surrounding an outer side of the emitter array region 250 to form the insulation region 37.

Each emitter includes a lower mirror 25, an active layer 27, an aperture forming layer 29, and a upper mirror 31, as those described with reference to FIG. 1, FIG. 2A, and FIG. 2B. The aperture forming layer 29 also includes an oxidation layer 29*x* and a window layer 29*w*, such that current flow is limited to the window layer 29*w*. A basic structure of each emitter is substantially the same as the emitter 150 described above, except for the insulation region 37 by ion implantation.

In addition, an ohmic contact layer 33 may be formed in each emitter. As described above, the ohmic contact layer 33 may include a circular portion 33*a* and protrusions 33*b* having a partial ring shape. Further, in each emitter region, oxidation holes 29*a* are disposed between the protrusions 33*b*, and via holes 39*a* are formed to correspond to the protrusions 33*b*. The oxidation holes 29*a* and the via holes 39*a* formed in each emitter are substantially the same as those formed in the emitter 150 described above. In particular, by forming the oxidation holes 29*a* separately in each emitter, sizes of the oxidation holes 29*a* may be smaller than those of the protrusions 33*b*, thereby improving reliability of the device. Further, the oxidation holes 29*a* are formed in an isolation region surrounded by the insulation region 37 formed by ion implantation. As such, defects may be prevented from moving near the window layer 29*w* during the oxidation process, thereby improving the reliability of the device.

Meanwhile, a connector 41 connecting the pad 40 and the ohmic contact layers 33 may be connected to each emitter through the via holes 39*a*. Each of the emitters may be connected in parallel. Although the connector 41 of FIG. 1 is shown as having a partial ring shape, it is difficult to form the connector 41 to have the partial ring shape when the connector 41 is connected to a plurality of emitters. As such, the connector 41 according to the illustrated exemplary embodiment may have a mesh shape forming circular openings 41*a*, as shown in FIG. 8A.

Since a manufacturing method of the VCSEL 200 having the emitter array is substantially similar to that of the VCSEL 100 described above, repeated descriptions thereof will be omitted.

Figure 9A:
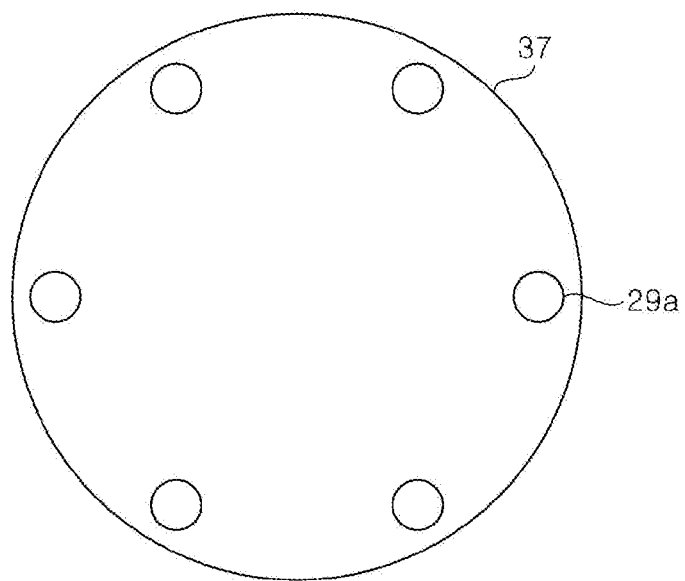
FIG. 9A is a schematic plan view illustrating oxidation holes for forming an oxidation layer according to an exemplary embodiment.
Figure 9B:
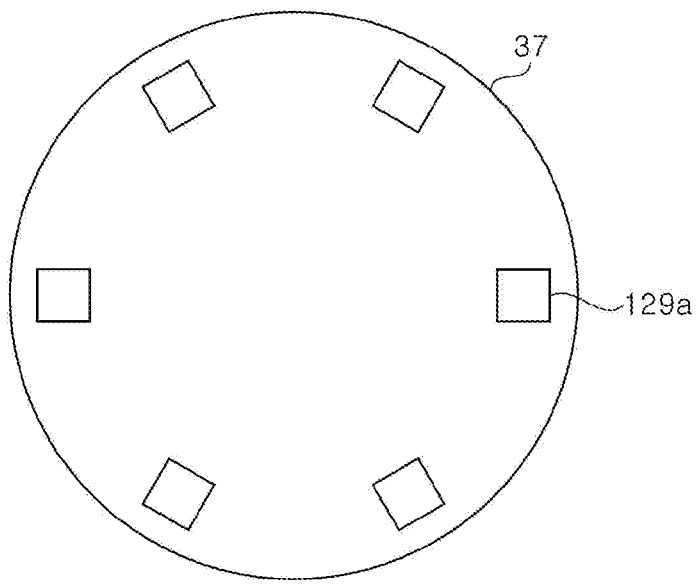
FIGS. 9B, 9C, and 9D are schematic plan views illustrating oxidation holes for forming an oxidation layer according to exemplary embodiments.
Figure 9C:
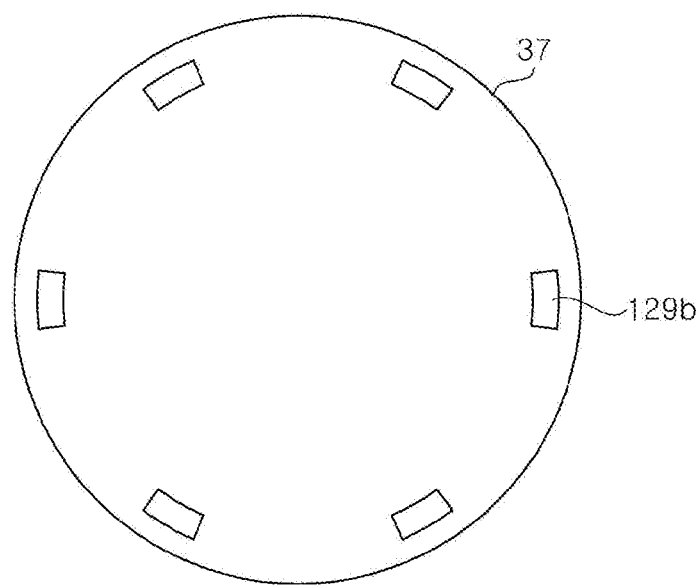
Figure 9D:
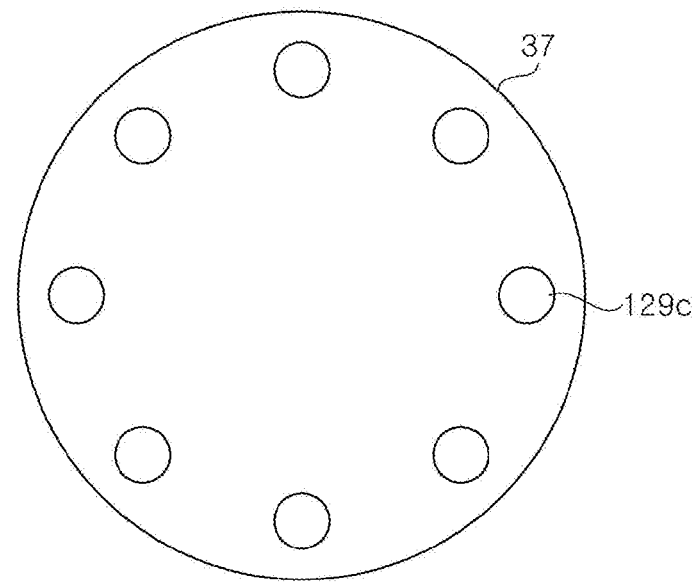

FIG. 9A is a schematic plan view illustrating oxidation holes 29*a* for forming an oxidation layer according to an exemplary embodiment, and FIGS. 9B through 9D are schematic plan views illustrating various modifications of oxidation holes for forming an oxidation layer according to exemplary embodiments.

Referring to FIG. 9A, the oxidation holes 29*a* are formed in an isolation region surrounded by an insulation region 37 by ion implantation. The oxidation holes 29*a* according to the illustrated exemplary embodiment may be formed to have substantially a circular or elliptical shape. In particular, six oxidation holes 29*a* may be formed, and an aperture forming layer 29 may be oxidized to form an oxidation layer 29*x*, and a window layer 29*w* is formed in the isolation region by the oxidation layers 29*x*. The window layer 29*w* may have substantially a circular shape.

A shape and arrangement of the oxidation holes 29*a* may be variously modified. For example, as illustrated in FIG. 9B, the oxidation holes 129*a* may have substantially a square or rectangular shape, and be disposed at locations corresponding to each vertex of the regular hexagon. In addition, as illustrated in FIG. 9C, although the oxidation holes 129*b* may have substantially a quadrangular shape, a side close to a center of the isolation region may curved. In addition, as illustrated in FIG. 9D, eight oxidation holes 129*c* may be disposed at locations corresponding to each vertex of the regular octagon.

The circular or elliptical oxidation holes 29*a* may be easily formed using photo and etching techniques, and may also increase the stability of an upper insulation layer 39 or a connector 41 formed thereon. However, the inventive concepts are not limit thereto, and in some exemplary embodiments, the oxidation holes 29*a* may have substantially a quadrangular shape or another shape as described above.

According to exemplary embodiments, it is possible to prevent the occurrence of electrical disconnection, by forming an insulation region by ion implantation. Furthermore, by placing the oxidation holes in the isolation region, it is possible to prevent defects formed during ion implantation from moving into an emitter, thereby providing a highly reliable VCSEL.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A vertical-cavity surface-emitting laser (VCSEL), comprising:
   a lower mirror;
   an upper mirror having an insulation region including implanted ions and an isolation region surrounded by the insulation region;
   an active layer interposed between the lower mirror and the upper mirror;
   an aperture forming layer interposed between the upper mirror and the active layer, and including an oxidation layer and a window layer disposed in the isolation region and surrounded by the oxidation layer;
   a connector disposed on the upper mirror;
   a plurality of oxidation holes disposed in the isolation region and passing through the upper mirror and the aperture forming layer; and
   an upper insulation layer covering the plurality of oxidation holes,
   wherein at least a portion of the connector is disposed in the oxidation holes.

2. The VCSEL of claim 1, wherein the insulation region extends from the upper mirror to a portion of the lower mirror.

3. The VCSEL of claim 1, further comprising an ohmic contact layer disposed on the upper mirror,
   wherein the ohmic contact layer includes a circular portion and protrusions protruding outwardly from the circular portion.

4. The VCSEL of claim 3, wherein the circular portion has a partially incised ring-shape.

5. The VCSEL of claim 4, wherein the oxidation holes are disposed between the protrusions.

6. The VCSEL of claim 5, wherein the oxidation holes have smaller widths than those of the protrusions, respectively.

7. The VCSEL of claim 4, further comprising:
   a surface protection layer covering the ohmic contact layer and the upper mirror; and
   the upper insulation layer disposed on the surface protection layer,
   wherein the oxidation holes pass through the surface protection layer.

8. The VCSEL of claim 7, further comprising a plurality of via holes passing through the upper insulation layer and the surface protection layer and exposing the ohmic contact layer,
   wherein the via holes are disposed to correspond to the protrusions.

9. The VCSEL of claim 8, further comprising a pad, wherein:
   the pad is disposed in the insulation region; and
   the connector extends from the pad and electrically connects the pad and the ohmic contact layer through the via holes.

10. The VCSEL of claim 1, wherein the oxidation holes have substantially a circular or a quadrangular shape.

11. A vertical-cavity surface-emitting laser (VCSEL) comprising:
    a lower mirror;
    an upper mirror having an insulation region including implanted ions and an isolation region surrounded by the insulation region;
    an emitter array including a plurality of emitters disposed in the isolation region;
    an active layer interposed between the lower mirror and the upper mirror;
    an aperture forming layer interposed between the upper mirror and the active layer, and including an oxidation layer and a window layer surrounded by the oxidation layer;
    a connector disposed on the upper mirror;
    a plurality of oxidation holes disposed in the isolation region and passing through the upper mirror and the aperture forming layer, each oxidation hole being disposed to correspond to each emitter of the emitter array; and
    an upper insulation layer covering the plurality of oxidation holes,
    wherein at least a portion of the connector is disposed in the oxidation holes.

12. The VCSEL of claim 11, wherein the insulation region extends from the upper mirror to a portion of the lower mirror.

13. The VCSEL of claim 11, further comprising ohmic contact layers disposed on the upper mirror to correspond to each emitter of the emitter array, respectively, wherein:
    each ohmic contact layer has a circular portion and protrusions protruding outwardly from the circular portion; and
    the oxidation holes are disposed between the protrusions.

14. The VCSEL of claim 13, wherein the circular portion has a partially incised ring-shape.

15. The VCSEL of claim 13, wherein the oxidation holes have smaller widths than those of the protrusions, respectively.

16. The VCSEL of claim 13, further comprising:
    a surface protection layer covering the ohmic contact layer and the upper mirror; and
    the upper insulation layer disposed on the surface protection layer,
    wherein the oxidation holes pass through the surface protection layer.

17. The VCSEL of claim 16, further comprising a plurality of via holes passing through the upper insulation layer and the surface protection layer and exposing the ohmic contact layer,
    wherein the via holes are disposed to correspond to the protrusions.

18. The VCSEL of claim 17, further comprising a pad, wherein:
    the pad is disposed in the insulation region; and
    the connector extends from the pad and electrically connects the pad and the ohmic contact layer through the via holes.

19. The VCSEL of claim 18, wherein the connector has a mesh shape including circular openings corresponding to each emitter.

20. The VCSEL of claim 11, wherein the oxidation holes have substantially a circular or a quadrangular shape.

* * * * *